(12) United States Patent
Porco et al.

(10) Patent No.: US 7,480,346 B2
(45) Date of Patent: Jan. 20, 2009

(54) METHOD AND APPARATUS FOR IMPROVING SECTOR TO SECTOR ISOLATION IN A FOURIER TRANSFORM MATRIX SYSTEM

(75) Inventors: Ronald L. Porco, Fort Worth, TX (US); Charles T. Patterson, Fort Worth, TX (US); Mark I. Van Horn, Arlington, TX (US)

(73) Assignee: Motorola, Inc., Schaumburg, IL (US)

( * ) Notice: Subject to any disclaimer, the term of this patent is extended or adjusted under 35 U.S.C. 154(b) by 204 days.

(21) Appl. No.: 11/531,329

(22) Filed: Sep. 13, 2006

(65) Prior Publication Data

US 2008/0070525 A1 Mar. 20, 2008

(51) Int. Cl.
*H04L 27/00* (2006.01)

(52) U.S. Cl. ...................................... 375/299
(58) Field of Classification Search ............... 375/267, 375/299, 347, 349; 700/53; 455/101, 132–141
See application file for complete search history.

(56) References Cited

U.S. PATENT DOCUMENTS 5,831,977 A * 11/1998 Dent ........................... 370/335

2003/0179829 A1 * 9/2003 Pinckley et al. ............. 375/295

OTHER PUBLICATIONS

Hanna et al. Hermite-Gaussian-Like Eigenvectors of the Discrete Fourier transform Matrix Based on the Singular-Value Decomposition of Its Orthogonal Projection Matrices, IEEE, vol. 51, No. 11, Nov. 2004, p. 2245-2254.*

* cited by examiner

*Primary Examiner*—Sam K Ahn

(57) ABSTRACT

A method for providing increased sector-to-sector isolation when transmitting data between a plurality of Fourier transform matrices, each having an input Fourier transform matrix (FTM), an output FTM, and a plurality of transmit paths therebetween is disclosed. The method includes applying a tone to one of the plurality of transmit paths so that a correlated output can be produced, measuring an output of the output FTM, correlating the output of the output FTM against the tone applied to produce a correlated output, adjusting a phase of the transmit path such that a direct current value of the correlated output is minimized, and adjusting an attenuation of the transmit path such that the direct current of the correlated output is minimized.

20 Claims, 4 Drawing Sheets

METHOD AND APPARATUS FOR IMPROVING SECTOR TO SECTOR ISOLATION IN A FOURIER TRANSFORM MATRIX SYSTEM

FIELD OF THE INVENTION

The present invention relates generally to wireless communications systems employing Fourier transform matrices, and, more particularly to improving sector-to-sector isolation (SSI) therein.

BACKGROUND

Amplifier matrixes such as the well-known Fourier transform matrix (FTM) have been used in cellular base stations for quite some time. An illustration of a Fourier transform matrix used to evenly distribute power amongst three amplifiers is provided in FIG. 1. Typically, a Fourier transform matrix has an input matrix portion, an output matrix portion, amplifiers coupled therebetween, and antennas coupled to the outputs of the output matrix.

When FTMs are paired to transmit to different sectors in a cellular system, optimal signal quality and isolation between sectors will be attained if each of the transmit paths has the same gain and phase. Such a system is said to have a high degree of sector-to-sector isolation (SSI). Imbalances between transmit paths in either gain or phase will degrade SSI resulting in decreased transmission quality and, in some systems, decreased data transmission rates.

What is needed is a system and method for helping to maximize SSI so that imbalances between transmit paths are minimized while transmission quality and transmission rates are not degraded.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
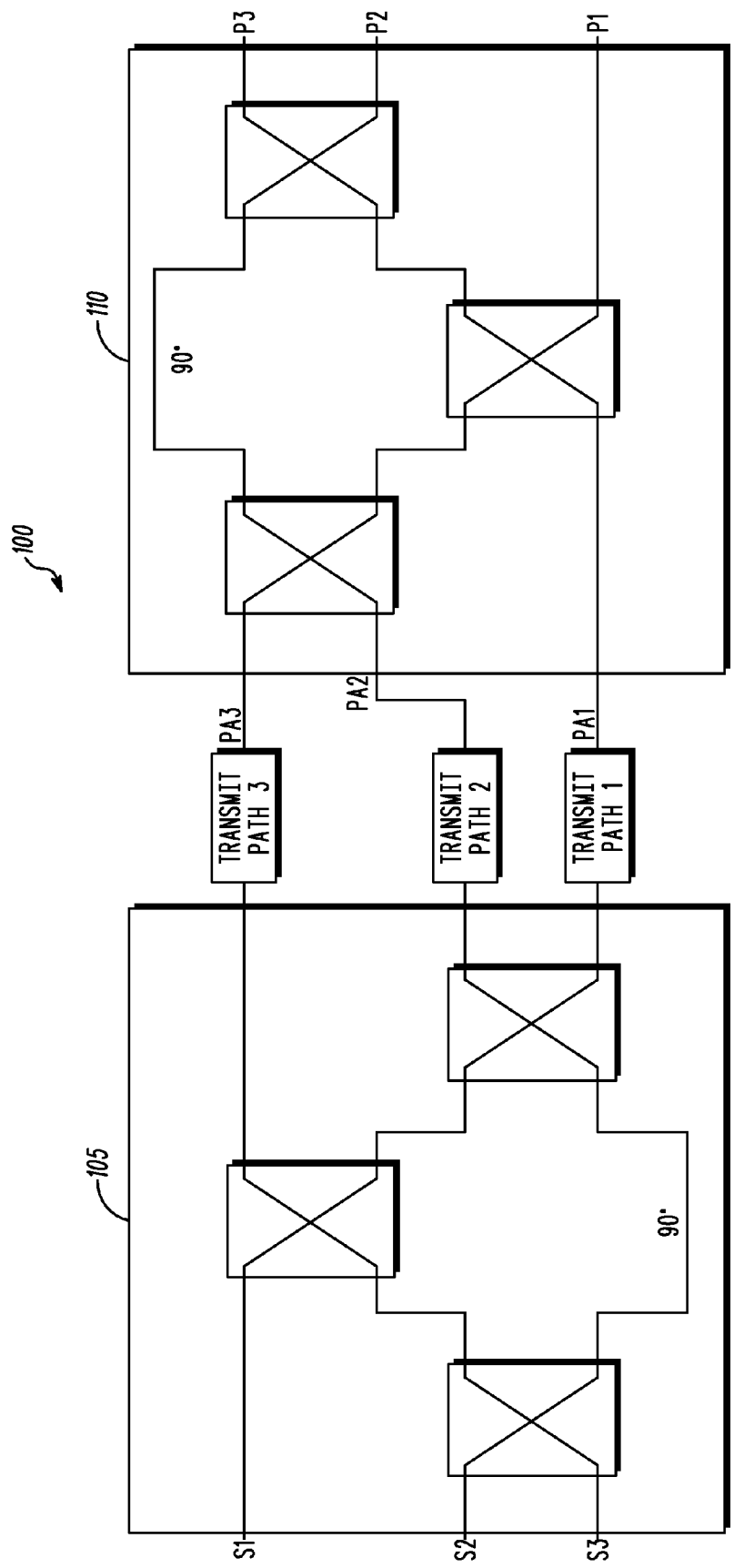
FIG. 1 is an example Fourier transform matrix pair in accordance with some embodiments of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail exemplary embodiments that are in accordance with the present invention, it should be observed that the embodiments reside primarily in combinations of method steps and apparatus components related to sector-to-sector isolation between Fourier transform matrices. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements, but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the invention described herein may be comprised of one or more conventional processors and unique stored program instructions that control the one or more processors to implement, in conjunction with certain non-processor circuits, some, most, or all of the functions of to sector-to-sector isolation between Fourier transform matrices described herein. The non-processor circuits may include, but are not limited to, a radio receiver, a radio transmitter, signal drivers, clock circuits, power source circuits, and user input devices. As such, these functions may be interpreted as steps of a method to perform to sector-to-sector isolation between Fourier transform matrices. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

A method is disclosed of increasing sector-to-sector isolation in a wireless communication network utilizing first and second Fourier transform matrices each with first, second, and third sectors and having first, second, and third transmit paths therebetween, the transmit paths having first, second, and third gains, respectively, and first, second, and third phases. The method includes setting the first Fourier transform matrix (FTM) to a pass thru mode, sending a known test signal into all sectors of the first FTM, and setting a first gain of the first transmit path and the third gain of the third transmit path to nominal values. The method also includes reducing the second gain of the second transmit path to zero, and determining a first null angle by adjusting the third phase of the third transmit path to minimize the first output of the second FTM.

A system for providing increased sector-to-sector isolation when transmitting data between a set of Fourier transform matrices is disclosed. The system includes first and second Fourier transform matrices, a plurality of transmit paths between the first and second Fourier transform matrices, a signal generator that places a signal into each of the plurality of transmit paths, and a phase adjuster interposing the signal generator and each transmit path for providing an appropriate phase adjustment of the generated signal into each transmit path. An AM detector that measures an output associated with the second Fourier transform matrix (FTM) due to the input into the transmit paths from the signal generator, a correlator that correlates output from the AM detector and the signal generated by the signal generator, and a phase shifter interposing the signal generator and each transmit path for providing a phase adjustment of the generated signal bases upon control signals from the correlator for determining a transmit path phase adjustment for improved sector-to-sector isolation. An attenuator on each of the transmit paths provides attenuation for each transmit path based upon control signals from the correlator to determine amplification needed for each transmit path for improved sector-to-sector isolation.

A method for providing increased sector-to-sector isolation when transmitting data between a set of Fourier transform matrices having a digital Fourier transform matrix (FTM), and analog FTM, and a plurality of transmit paths therebetween is disclosed. The method includes applying a tone to two of the transmit paths, measuring an output of the analog FTM, correlating the output against the tone applied to produce a correlated output; and adjusting a phase of a transmit path to minimize the correlated output. The method also includes adjusting an attenuation of a transmit path to minimize the correlated output.

Referring now to FIG. 1, a Fourier transform matrix pair in accordance with some embodiments of the invention is shown. The Fourier transform matrix 100 has an input Fourier transform matrix 105 and an output Fourier transform matrix 110. Each of these Fourier transform matrices or FTM's receives a set of input signals which are transformed into a set of output signals. The FTM's may be variously implemented in hardware, software or a combination thereof. For simplicity, standard FTM symbology has been used in FIG. 1. In FIG. 1 the inputs to FTM 105 are shown as S1, S2 and S3. The outputs of FTM 105 correspond to the inputs of FTM 110, PA3, PA2 and PA1. The outputs of FTM 110 are denoted as P3, P2 and P1. It can be seen from FIG. 1 that the exemplary FTMs 105 and 110 are 3×3 matrices, but larger matrices could be used with additional inputs and outputs. It may also be seen from FIG. 1 that transmit paths 1, 2 and 3 are provided for the transmission of signals between FTM 105 and FTM 110. The transmit paths may comprise exciters, power amplifiers and/or other equipment necessary for transmission and/or conditioning of the signals between FTM 105 and FTM 110.

In the embodiment shown in FIG. 1, the FTM 105 and the FTM 110 provide a specific relationship providing their respective inputs and outputs. An example of the relationship between the input and output of the FTM matrix 105 is shown in Table 1 as the Input Matrix. The relationship between the inputs and the outputs of the FTM 110 are shown under the Output Matrix shown in Table 1.

$$PA3 = \frac{1}{\sqrt{3}} \cdot \vec{S}1 \angle 0° + \frac{1}{\sqrt{3}} \cdot \vec{S}2 \angle -90° + \frac{1}{\sqrt{3}} \cdot \vec{S}3 \angle -180°$$ Equation 1

$$PA2 = \frac{1}{\sqrt{3}} \cdot \vec{S}1 \angle -90° + \frac{1}{\sqrt{3}} \cdot \vec{S}2 \angle 60° + \frac{1}{\sqrt{3}} \cdot \vec{S}3 \angle -150°$$ Equation 2

$$PA1 = \frac{1}{\sqrt{3}} \cdot \vec{S}1 \angle -180° + \frac{1}{\sqrt{3}} \cdot \vec{S}2 \angle -150° + \frac{1}{\sqrt{3}} \cdot \vec{S}3 \angle -120°$$ Equation 3

Similarly the FTM 110 has a relationship between inputs and outputs that may be represented by Equations 4, 5 and 6 below.

$$P1 = \frac{1}{\sqrt{3}} \cdot PA1 \angle 0° + \frac{1}{\sqrt{3}} \cdot PA2 \angle -90° + \frac{1}{\sqrt{3}} \cdot PA3 \angle -180°$$ Equation 4

$$P2 = \frac{1}{\sqrt{3}} \cdot PA1 \angle -90° + \frac{1}{\sqrt{3}} \cdot PA2 \angle 60° + \frac{1}{\sqrt{3}} \cdot PA3 \angle -150°$$ Equation 5

$$P3 = \frac{1}{\sqrt{3}} \cdot PA1 \angle -180° + \frac{1}{\sqrt{3}} \cdot PA2 \angle -150° + \frac{1}{\sqrt{3}} \cdot PA3 \angle -120°$$ Equation 6

The FTM 105 and the FTM 110 will provide the greatest signal quality and highest possible data rate between them when a high degree of SSI is achieved. Ideal SSI is achieved when the input and output matricies match equations 1-3 and 4-6 respectively and there is no variation in gain or phase between the FTM 105 and the FTM 110. In an ideal case, there would be no difference between gain or phase of a signal passed through transmit path 1, 2 or 3. Thus, a proper path angle or phase could also be defined as one that produces optimal SSI. However, any gain or phase variation in one path that is not duplicated in the other two paths will result in a degradation of the sector-to-sector isolation. In some embodiments, differences or imbalances between the transmit paths may be calibrated out of the system 100 thereby providing a high degree of sector-to-sector isolation. In such a case, it may also be possible that the three transmit paths will track

TABLE 1

| | Input Matrix | | | | Output Matrix | | |
|---|---|---|---|---|---|---|---|
| | PA3 | PA2 | PA1 | | P1 | P2 | P3 |
| S1 | 0.577∠0° | 0.577∠−90° | 0.577∠−180° | PA1 | 0.577∠0° | 0.577∠−90° | 0.577∠−180° |
| S2 | 0.577∠−90° | 0.577∠60° | 0.577∠−150° | PA2 | 0.577∠−90° | 0.577∠60° | 0.577∠−150° |
| S3 | 0.577∠−180° | 0.577∠−150° | 0.577∠−120° | PA3 | 0.577∠−180° | 0.577∠−150° | 0.577∠−120° |

The relationship between the inputs and outputs provided by FTM 105 can also be represented more formally by the Equations 1, 2 and 3, shown below. The equations below match Table 1 above with $1/\sqrt{3}$ being equal to 0.577 to three decimal places.

fairly closely together in terms of amplitude or phase changes over various time and temperature ranges.

Figure 2:
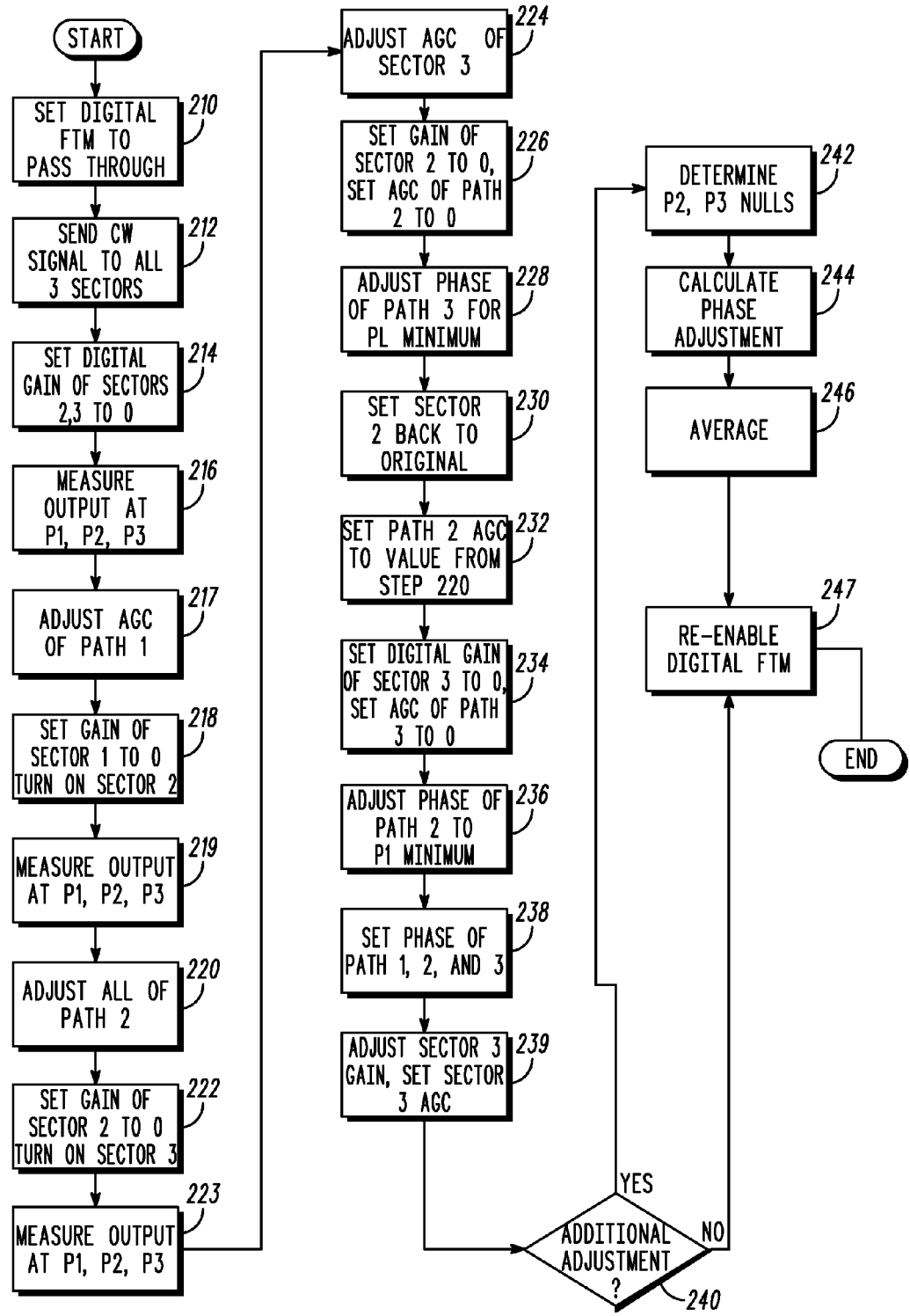
FIG. 2 is a flow diagram corresponding to one method of calibrating an FTM matrix system according to some embodiments of the invention.

Referring now to FIG. 2, a flow diagram corresponding to one of the exemplary methods of calibrating an FTM matrix system according to some embodiments of the invention is shown. The flow diagram 200 corresponds to one exemplary method of calibrating the FTM matrix 100 of FIG. 1 to achieve a high degree of sector-to-sector isolation. The steps and methods described with respect to FIG. 2 may occur during a time when little or no data transmission is occurring on any of the transmit paths. Beginning at step 210 the digital FTM 105 is set to a pass thru mode. The pass thru mode allows each input signal to be passed directly to the associated forward path link with no change in amplitude or phase. Table 2 and Equations 7, 8, and 9 shown below illustrate the relationship between inputs S1, S2 and S3 and the transmit paths PA1, PA2 and PA3 given as outputs when the FTM 05 is operating in pass thru mode.

TABLE 2

|    | Path 3 | Path 2 | Path 1 |
|----|--------|--------|--------|
| S1 | 0      | 0      | 1∠0°   |
| S2 | 0      | 1∠0°   | 0      |
| S3 | 1∠0°   | 0      | 0      |

$$\text{Path3} = \vec{S}3 \angle 0° \quad \text{Equation 7}$$

$$\text{Path2} = \vec{S}2 \angle 0° \quad \text{Equation 8}$$

$$\text{Path3} = \vec{S}1 \angle 0° \quad \text{Equation 9}$$

At step 212 a continuous wave form (CW) signal is provided as inputs into all three sectors. That is the same CW signal is provided into each of inputs S1, S2 and S3 of the FTM 105. At step 214 the digital gain corresponding to sectors 2 and 3, or S2 and S3, is set to zero. At step 216 the total output power at the outputs of the FTM 110, P1, P2 and P3 are then measured. At step 217, an automatic gain control of path 1 is adjusted to provide a predetermined summed output power at the outputs P1, P2, and P3 of FTM 110. At step 218 the gain associated with sector 1 is returned to zero and the gain associated with sector 2 is reactivated. Following this, at step 219, the total power output at P1, P2 and P3 is measured again. At step 220, an automatic gain control associated with the FTM 110 can now be adjusted such that the same total output power measured in step 219 matches the output power obtained as measured at step 216.

At step 222 the gain of sector 2 is set to zero and the gain associated with sector 3 is turned on. As before, at step 223, the total power output at P1, P2 and P3 is measured. At step 224 an automated gain control associated with path 3 is adjusted such that the output measured at P1, P2 and P3 will match the measured output obtained for P1, P2 and P3 at step 216. At step 226, the gain of sector 2 is set to zero and the automatic gain control of path 2 is also set to zero. According to equation 4 with PA2 now set to zero, the power at P1 is a summation of path 1 times 0° and path 3 times 180°. Since all three sectors were initially excited with the same CW signal, the phase of path 3 may be adjusted until a minimum output power is provided at P1. This occurs at step 228. The phase adjustment required in path 3 to minimize the power output at P1 may be retained for use as described later in the process. The angle of one path necessary to create a 180 degree phase difference at the output of any FTM port with respect to another path at the same output port is referred to as a "null angle."

At step 230 the gain of sector 2 may be set back to its original value and at step 232 the automatic gain control of path 2 may be reset to the value obtained at step 220. At step 234 the gain of sector 3 is set to zero and the automatic gain control of path 3 is also set to zero. At step 236 the phase of path 2 may be adjusted until a minimum power output is provided at P1. This will occur when the PA 1 term and the PA2 term are 180° out of phase. The phase adjustment necessary to achieve the minimal power output at P1 may be added to 90° to obtain a path two angle term which will be used later in the process as described below. At step 238 the phases of the three paths are set. Path 1 is set to zero, path 2 is set to the value obtained at step 236 plus 90 degrees, and path 3 is set to the value obtained at step 228. At step 239, the digital gain of sector 3 is set back to its original value and the automatic gain control of sector 3 is set to the value from step 224.

In some embodiments the procedure may end at this point or it may continue as shown by step 240. The decision about whether to continue the process as will be described is based upon the desire to improve the worst case sector-to-sector isolation between output P1, P2 and P3 even further by using the outputs at P2 and P3 to determine the best overall angular combination for paths 1, 2 and 3. If the process continues from step 240 the null angles for P2 and P3 may be obtained at step 242. The null angles previously obtained may be used as starting points, or mathematical estimates, to obtain the additional angles for P2 and P3. Thus, the path angles can be mathematically estimated using the null angles P2 and P3 for their associated FTM port. Table 3, shown below, provides an ideal relationship among the base angles used to obtain null outputs on P1, P2 or P3. Note that Table 3 provides an ideal case scenario and the angles actually needed to provide null outputs may vary by about +/−10°. However, the relationships shown in Table 3 may be used as a starting point or estimate to reduce the time necessary to perform the task.

TABLE 3

|    | Path 1 | Path 2 | Path 3 |
|----|--------|--------|--------|
| P1 | $\phi_{11\text{Null}} = 0°$ | $\phi_{12\text{Null}}$ | $\phi_{13\text{Null}}$ |
| P2 | $\phi_{21\text{Null}} = 0°$ | $\phi_{22\text{Null}} = \phi_{12\text{Null}} + 120°$ | $\phi_{23\text{Null}} = \phi_{13\text{Null}} - 120°$ |
| P3 | $\phi_{31\text{Null}} = 0°$ | $\phi_{22\text{Null}} = \phi_{32\text{Null}} - 120°$ | $\phi_{33\text{Null}} = \phi_{13\text{Null}} + 120°$ |

At step 244 the angles determined at step 242 may be used in the following equations to calculate the necessary phase adjustment of each transmit path to achieve optimal sector-to-sector isolation at each output port. In the equations below, $\Phi_{PathX}$ is the phase adjustment of the transmit path indicated by X and $\Phi_{YXNull}$ is the Null angle between respective paths denoted by Y and Z.

$$\phi_{Path1} = 0° \quad \text{Equation 10}$$

$$\phi_{Path2}(P1) = \phi_{12Null} + 90° \quad \text{Equation 11}$$

$$\phi_{Path2}(P2) = \phi_{22Null} - 30° \quad \text{Equation 12}$$

$$\phi_{Path2}(P3) = \phi_{32Null} - 150° \quad \text{Equation 13}$$

$$\phi_{Path3}(P1) = \phi_{13Null} + 0° \quad \text{Equation 14}$$

$$\phi_{Path3}(P2) = \phi_{23Null} + 120° \quad \text{Equation 15}$$

$$\phi_{Path3}(P3) = \phi_{33Null} - 120° \quad \text{Equation 16}$$

At step 246 the various angle measurements obtained by equations 11 through 16 may be averaged to provide an optimized result for the overall performance of the three outputs P1, P2 and P3. Equations 17 and 18 below illustrate the relationship between the calculated angles and the averages.

$$\phi_{Path2} = \frac{\phi_{Path2}(P1) + \phi_{Path2}(P2) + \phi_{Path2}(P3)}{3} \quad \text{Equation 17}$$

$$\phi_{Path2} = \frac{\phi_{Path3}(P1) + \phi_{Path3}(P2) + \phi_{Path3}(P3)}{3} \qquad \text{Equation 18}$$

Regardless of whether steps 242, 244, or 246 occur, at step 247 the digital FTM 105 is re-enabled.

By calibrating the gain and phase as described with respect to FIG. 2 an SSI of better than −30 dBc may be expected, but levels of −60 dBc are possible. However, component variation over time, temperature and frequency may cause this level of performance to degrade to around 0 dBc. This will result in degraded signal quality performance and in some instances this may result in slower data rates from the system. A measuring means such as power detectors may be provided to measure power drifts amongst the three transmit paths. The gains associated with paths 1, 2 and 3 could then be modified to compensate. As discussed, it is important that the gain associated with each of the paths be similar to achieve a high degree of SSI. As the change and power output associated with one path changes, the power output associated with the other two paths may be adjusted to the same degree. Thus, SSI may be maintained even though the gain associated with one or more of the transmit paths may change based on time, temperature and frequency variations.

Figure 3:
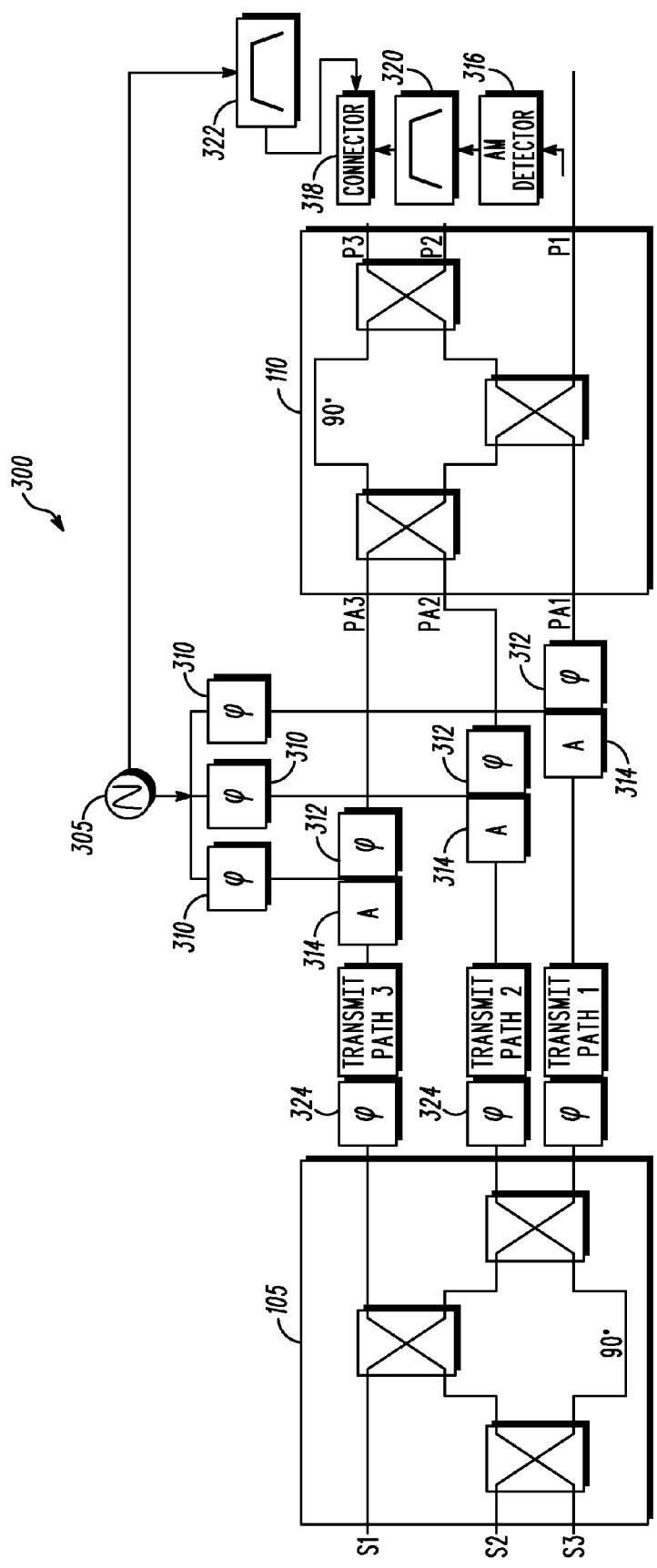
FIG. 3 is a Fourier transform matrix pair with an exemplary sector-to-sector isolation improvement means in accordance with some embodiments of the invention.

Referring now to FIG. 3 an FTM pair 300 with sector-to-sector isolation improvement means is shown according to some embodiment of the invention is shown. The FTM pair 300 is similar in some respects to the FTM pair 100 shown in FIG. 1. As can be seen, the FTM pair 300 provides additional tracking and adjustment mechanisms, which may be employed to improve SSI between the outputs of FTM 110. A signal generator 305 is provided that can add inputs such as low frequency tones into each of the transmit paths 1, 2 and 3. A phase adjuster 310 may be provided between the signal generator 305 in each of the transmit paths 1, 2 and 3. Also associated with each transmit path 1, 2 and 3 is a phase shifter 312 and an attenuator 314 that may also be placed in each of the transmit paths 1, 2 and 3. On the output P1 of the FTM 110 an amplitude modulation detector 316 may be provided. Both the output from the signal generator 305 and the output from the AM detector 316 may be provided to a correlator 318. Both the AM detector 316 and the signal generator 305 may have their outputs into the correlator 318 filtered by filters 320 and 322 respectively. In some embodiments, the filters 320 through 322 may be band pass filters or other filters that may be needed to provide an adequate signal into the correlator 318. As will be described in greater detail below, transmit path phase adjustments 324 may be used to provide the final phase adjustment needed on each of transmit paths 1, 2 and 3 in order to obtain the requisite degree of sector-to-sector isolation. As will also be described, it may be necessary to adjust the gain associated with each of the paths in order to obtain the requisite degree of sector-to-sector isolation.

Figure 4:
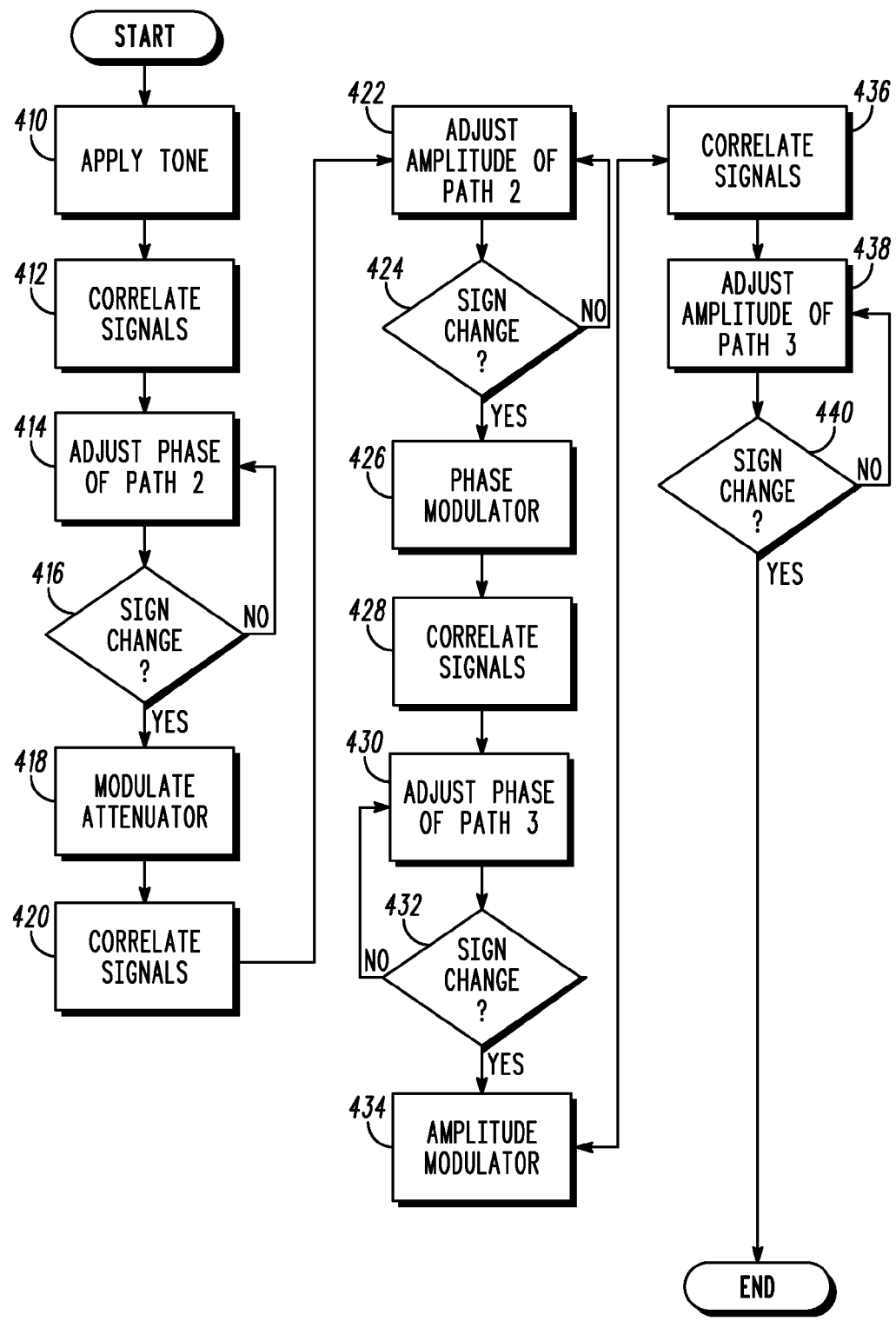
FIG. 4 is a flow diagram illustrating one exemplary mode of operation of the FTM pair of FIG. 3 according to some embodiments of the invention.

Referring now to FIG. 4, a flow diagram illustrating one mode of operation of the FTM pair of FIG. 3 according to some embodiments of the invention is shown. The flow diagram 400 provides one method of utilizing the additional equipment provided on the FTM pair 300 to achieve SSI. At step 410, a tone or CW signal in a low frequency range is provided to each of the transmit paths by the signal generator 305. The phase adjuster 310 associated with transmit path 1 is set to 0°. The phase adjuster associated with transmit path 2 is set to −90°. In another embodiment, rather than using phase adjusters 310, the signal generated by the signal generator 305 could be directly modulated. In some embodiments an 11 khz tone will be provided by the signal generator 305, although, in other embodiments, a different frequency may be used.

At step 412 the output signal provided on output P1 and the input from the signal generator 305 may be correlated at the correlator 318. At FTM 110 P1 output, the FTM 110 has rotated the PA2 phase by −90°. The phase modulation of path two was previously rotated at an additional −90° by the phase adjuster 310. Therefore the phases of the low frequency modulation between paths 1 and 2 as seen at FTM 110 output port P1 should be approximately 180° apart. In the event that the amplitude difference between paths 1 and 2 is not minimized, an amplitude or phase imbalance may exist between the two paths. The envelope of the difference between paths 1 and 2 as seen at FTM 110 output P1 may be correlated or compared with the original modulating signal. The direct current term of the correlation product provides a voltage that is proportional to the sign and magnitude of the phase error between paths 1 and 2. At step 414 the phase angle of path 2 may be adjusted to compensate for any error. This may be done for example by the phase shifter 312 associated with transmit path 2. Adjustments may be made incrementally to the phase of path 2 until the phase shift causes a reversal of the sign of the error product provided by the correlator 318. Thus, at step 416 the product or the correlation or comparison may be monitored for a sign change and returning for additional adjustments to step 414 until the change is observed and then proceeding to step 418.

At step 418 the phase modulation is turned off and the signal generated by the signal generator 305 is used to modulate a voltage controlled attenuator 314 associated with transmit paths 1 and 2. Once again, at step 420 the signal provided on output P1 and the signal provided by the signal generator may be correlated by the correlator 318. The amplitude of transmit path 2 may then be adjusted at step 422 until a sign change in the correlator error term occurs at step 424.

Following the steps described above, paths 1 and 2 may be both gain and phase balanced. Continuing at step 426 the amplitude modulation at paths one and two is turned off while the phase modulation of paths 1 and 3 are enabled with 0° phase rotation provided by the associated phase adjuster 310. Since the FTM 110 will rotate the phase of path 3 by −180° the AM detector 316 will record a minimal reading when path 1 and path 3 are phase aligned. Therefore, once again, the signals may be correlated by the correlator 318 at step 428. At step 430 the phase of path 3 may be adjusted until a sign change occurs at step 432. At step 436 the phase adjustment associated with transmit paths 1 and 3 are disabled in order to provide for an amplitude attenuation provided by the associated attenuators 314. At step 438 the amplitude of path 3 may once again be adjusted until a sign change occurs at step 440 in the correlator error term.

It is understood that the technique described above with respect to FIG. 4 may be repeated on or performed instead on FTM output ports 2 and 3. That is, the AM detector 316 may be configured to read the output signal used in the correlation from FTM output P2 or P3. It is also understood that the process described above with respect to FIG. 4 and associated with the FTM pair 300 may be repeated based on intervals of time, temperature changes, or other intervals.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. A method of increasing sector-to-sector isolation in a wireless communication network utilizing first and second Fourier transform matrices each with first, second, and third sectors and having first, second, and third transmit paths therebetween, the transmit paths having first, second, and third gains, respectively, and first, second, and third phases, respectively, the method comprising:
   setting the first Fourier transform matrix (FTM) to a pass thru mode;
   sending a known test signal into all sectors of the first FTM;
   setting a first gain of the first transmit path and the third gain of the third transmit path to zero;
   reducing the second gain of the second transmit path to zero; and
   determining a first null angle by adjusting the third phase of the third transmit path to minimize the first output of the second FTM.

2. The method of claim 1, further comprising:
   returning the second gain of the second transmit path to its nominal value;
   reducing the third gain of the third transmit path to zero;
   adjusting the second phase of the second transmit path to minimize a first output of the second FTM;
   determining a second path angle by adding 90 degrees to the phase of the second transmit path; and
   setting the second phase of the second transmit path to the determined second path angle.

3. The method of claim 2, further comprising mathematically estimating path angles based upon second and third outputs of the second FTM.

4. The method of claim 3, further comprising measuring null angles at the second and third outputs of the second FTM.

5. The method of claim 4, further comprising setting the second and third phase of the second and third transmit paths based upon averages of the measured null angles.

6. The method of claim 2, wherein all steps occur during a time period having no data transmission on the first, second, and third transmit paths.

7. A wireless communication system that provides sector-to-sector isolation when transmitting data between a plurality of Fourier transform matrices, the system comprising:
   first and second Fourier transform matrices;
   plurality of transmit paths between the first and second Fourier transform matrices;
   a signal generator that places a signal into each of the plurality of transmit paths;
   a first phase adjuster interposing the signal generator and each transmit path for providing an appropriate phase adjustment of the generated signal into each transmit path;
   an amplitude modulation (AM) detector that measures an output associated with the second Fourier transform matrix (FTM) due to the input into the transmit paths from the signal generator;
   a correlator that correlates output from the AM detector and the signal generated by the signal generator;
   a second phase shifter interposing the first phase adjuster and each transmit path, the phase shifter provides a phase adjustment of the transmit path phase for establishing a sector-to-sector isolation that is greater than a predetermined amount based upon control signals from the correlator; and
   an attenuator on each of the transmit paths, each attenuator provides attenuation for its transmit path in order to determine an appropriate amplification needed for each transmit path for establishing a sector-to-sector isolation that is greater than a predetermined amount, each attenuator receives control signals from the correlator.

8. The system of claim 7, further comprising a third phase shifter within each transmit path that provides a final phase adjustment on each transmit paths.

9. The system of claim 7, wherein the second phase shifter on each transmit path also provides a final phase adjustment on each transmit path.

10. The system of claim 7, wherein the signal generator provides a constant waveform signal.

11. The system of claim 7, wherein the signal generator provide a constant waveform signal having a frequency of about 11 kHz.

12. The system of claim 7, further comprising
    a band-pass filter interposing the signal generator and the correlator; and
    a band-pass filter interposing the AM detector and the correlator.

13. The system of claim 7, wherein the first FTM is a digital FTM.

14. The system of claim 7, wherein the second FTM is an analog FTM.

15. The system of claim 7 wherein each of the FTMs are a 3 by 3 FTM and there are three transmit paths therebetween.

16. A method for providing increased sector-to-sector isolation when transmitting data between a plurality of Fourier transform matrices, each having an input Fourier transform matrix (FTM), an output FTM, and a plurality of transmit paths therebetween, the method comprising:
    applying a tone to one of the plurality of transmit paths so that a correlated output can be produced;
    measuring an output of the output FTM;
    correlating the output of the output FTM against the tone applied to produce a correlated output;
    adjusting a phase of the transmit path such that a direct current value of the correlated output is compensated for errors; and
    adjusting an attenuation of the transmit path such that the direct current of the correlated output is compensated for errors.

17. The method of claim 15, wherein adjusting an attenuation further comprises adjusting the attenuation using a voltage modulated attenuator.

18. The method of claim 15, wherein adjusting a phase further comprises incrementally adjusting the phase of the transmit path until a sign change of the direct current value is detected in the correlated output.

19. The method of claim 15, further comprising providing a phase adjustment in at least one transmit path based upon the phase difference of the tone and the FTM output.

20. The method of claim 15, further comprising providing a change in a gain in at least one transmit path based upon the amplitude difference of the tone and the FTM output.

* * * * *